(12) United States Patent
Millard et al.

(10) Patent No.: US 7,794,233 B1
(45) Date of Patent: Sep. 14, 2010

(54) FLEXIBLE CIRCUIT MEMBER FOR ELECTRICALLY COUPLING CONNECTORS WITH ONE ANOTHER

(75) Inventors: Steven J. Millard, Mechanicsburg, PA (US); Jason M'Cheyne Reisinger, Carlisle, PA (US); Richard Elof Hamner, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/481,210

(22) Filed: Jun. 9, 2009

(51) Int. Cl.
 *H01R 9/09* (2006.01)
(52) U.S. Cl. .......................... 439/65; 439/67
(58) Field of Classification Search ............ 439/65, 439/67, 77, 493, 62
 See application file for complete search history.

(56) References Cited

U.S. PATENT DOCUMENTS

| | | | |
|---|---|---|---|
| 4,085,990 A | 4/1978 | Jayne | |
| 4,480,569 A | 11/1984 | van der Veen et al. | |
| 4,518,210 A | 5/1985 | Morrison | |
| 4,603,928 A | 8/1986 | Evans | |
| 4,626,056 A | 12/1986 | Andrews et al. | |
| 4,629,270 A | 12/1986 | Andrews et al. | |
| 4,693,529 A | 9/1987 | Stillie | |
| 4,731,698 A | 3/1988 | Millot et al. | |
| 4,840,569 A | 6/1989 | Cabourne | |
| 4,881,901 A * | 11/1989 | Mendenhall et al. ......... | 439/65 |
| 5,092,781 A | 3/1992 | Casciotti et al. | |
| 5,102,342 A | 4/1992 | Marian | |
| 5,171,154 A | 12/1992 | Casciotti et al. | |
| 5,205,739 A | 4/1993 | Malo et al. | |
| 5,228,863 A | 7/1993 | Campbell et al. | |
| 5,248,261 A | 9/1993 | Conroy-Wass et al. | |
| 5,959,847 A * | 9/1999 | McMillian et al. .......... | 361/796 |
| 6,062,872 A | 5/2000 | Strange et al. | |
| 6,077,090 A | 6/2000 | Campbell et al. | |
| 6,411,517 B1 | 6/2002 | Babin | |
| 6,672,878 B2 | 1/2004 | Dean | |
| 7,297,015 B1 | 11/2007 | Desrosiers et al. | |
| 7,374,441 B2 | 5/2008 | Rubenstein | |
| 7,419,400 B1 | 9/2008 | Taylor | |
| 7,425,134 B1 | 9/2008 | Taylor | |
| 7,438,582 B2 | 10/2008 | Taylor | |
| 7,632,106 B2 | 12/2009 | Nakamura | |
| 2007/0097662 A1 | 5/2007 | Dean | |
| 2008/0227314 A1 | 9/2008 | Taylor | |

OTHER PUBLICATIONS

Neoconix PCBeam™ Interposer Design Guide, Neoconix, Rev. 070925, 4 pgs.

* cited by examiner

*Primary Examiner*—Gary F. Paumen (57) ABSTRACT

An electrical connector assembly couples a circuit board with at least one of a motherboard and a backplane board. The connector assembly includes a connector and a flexible circuit member. The connector has a mating interface and a mounting interface. The mating interface electrically couples the connector with the circuit board. The mounting interface secures the connector to the motherboard. The flexible circuit member electrically interconnects the mating and mounting interfaces with one another and with at least one of the motherboard and the backplane board. The flexible circuit member electrically interconnects the circuit board with the backplane board via a conductive pathway that bypasses the motherboard.

20 Claims, 8 Drawing Sheets

FLEXIBLE CIRCUIT MEMBER FOR ELECTRICALLY COUPLING CONNECTORS WITH ONE ANOTHER

BACKGROUND OF THE INVENTION

The subject matter herein relates generally to electrical connectors and, more particularly, to electrical connectors that are interconnected by a flexible circuit member.

Blade server systems may include several blade server circuit boards that are mounted to a backplane board. In some known blade server systems, the blade server circuit boards are loaded into a server box in a parallel relationship. For example, the blade server circuit boards are placed into the server box so that the blade server circuit boards are approximately parallel with respect to one another. A backplane circuit board, or backplane board, is located within the server box along the back face or wall of the box. The backplane board and blade server circuit boards are approximately perpendicular with respect to one another when the blade server circuit boards are loaded into the server box. A motherboard may be provided in the server box and may engage the blade server circuit boards when the circuit boards are loaded into the box. Connectors mounted to the blade server circuit boards and the motherboard permit communication between the blade server circuit boards and the motherboard. Additional connectors mounted to the motherboard and the backplane board permit communication between the motherboard and the backplane board.

The backplane board and blade server boards may communicate data signals and/or electric power with one another using the connectors and the motherboard. The blade server boards include electronic components mounted thereon that communicate data signals and/or electronic power with the backplane board. The backplane board includes one or more additional connectors disposed along or proximate to an outside surface of the server box to permit peripheral devices to mate with and thereby communicate with the backplane board. The peripheral devices communicate data signals and/or electric power with the blade server circuit boards via the backplane board.

In order to route data signals between components mounted to the blade server circuit boards and the backplane board, conductive traces in the blade server circuit boards extend from the components to connectors that mate the blade server circuit boards with the motherboard. Additional conductive traces in the motherboard communicate the data signals through the motherboard to one or more additional connectors. The additional connectors convey the data signals to conductive traces in the backplane board, which communicate the data signals to the peripheral devices via the connectors mounted to the backplane board.

The routing of data signals along such a path may require the data signals to pass along a variety of conductive pathways held in various different materials. For example, data signals may be communicated along conductive traces in different circuit boards and along different conductive contacts in various connectors. As the data signals are transmitted between these different pathways held in different materials, the data signals may become affected by the varied materials. For example, with respect to differential pair data signals, the time skew of the signals may be increased as the propagation path passes through several, non-homogenous materials. With increasing data rates, the time skew induced in the differential pair signals presents an increasing obstacle with respect to data reliability.

Thus, a need exists for a system or assembly that reduces the number of various materials and/or components through which data signals may travel along conductive pathways. Reducing the number of materials and/or components may improve signal integrity and reliability by reducing time skew in data signals, for example.

BRIEF DESCRIPTION OF THE INVENTION

In one embodiment, an electrical connector assembly is provided. The connector assembly electrically couples a circuit board with at least one of a motherboard and a backplane board. The connector assembly includes a connector and a flexible circuit member. The connector has a mating interface and a mounting interface. The mating interface electrically couples the connector with the circuit board. The mounting interface secures the connector to the motherboard. The flexible circuit member electrically interconnects the mating and mounting interfaces with one another and with at least one of the motherboard and the backplane board. The flexible circuit member electrically interconnects the circuit board with the backplane board via a conductive pathway that bypasses the motherboard. Optionally, the flexible circuit member electrically interconnects the circuit board with the backplane board via a conductive pathway that bypasses the motherboard. The flexible circuit member may include a conductive trace that is held in a flexible film. In one embodiment, the connector assembly includes a plurality of the connectors and the flexible circuit member electrically interconnects the connectors with one another.

In another embodiment, another electrical connector assembly is provided. The connector assembly electrically interconnects circuit boards disposed in a parallel relationship with one another. The connector assembly includes first and second connectors and a flexible circuit member. Each of the first and second connectors has a mating interface for engaging and electrically coupling each of the first and second connectors with a different one of the circuit boards. The mounting interfaces are configured to mount the first and second connectors to a motherboard. The flexible circuit member electrically interconnects the first and second connectors with one another along a conductive pathway that bypasses the motherboard. The first and second connectors engage the circuit boards in a non-parallel relationship with respect to the motherboard. Optionally, the first and second connectors engage the circuit boards in a perpendicular relationship with respect to the motherboard. In one embodiment, the flexible circuit member is configured to extend from the first connector to the second connector along a path extending between the motherboard and the circuit board engaged by the second connector.

DETAILED DESCRIPTION OF THE INVENTION

Figure 1:
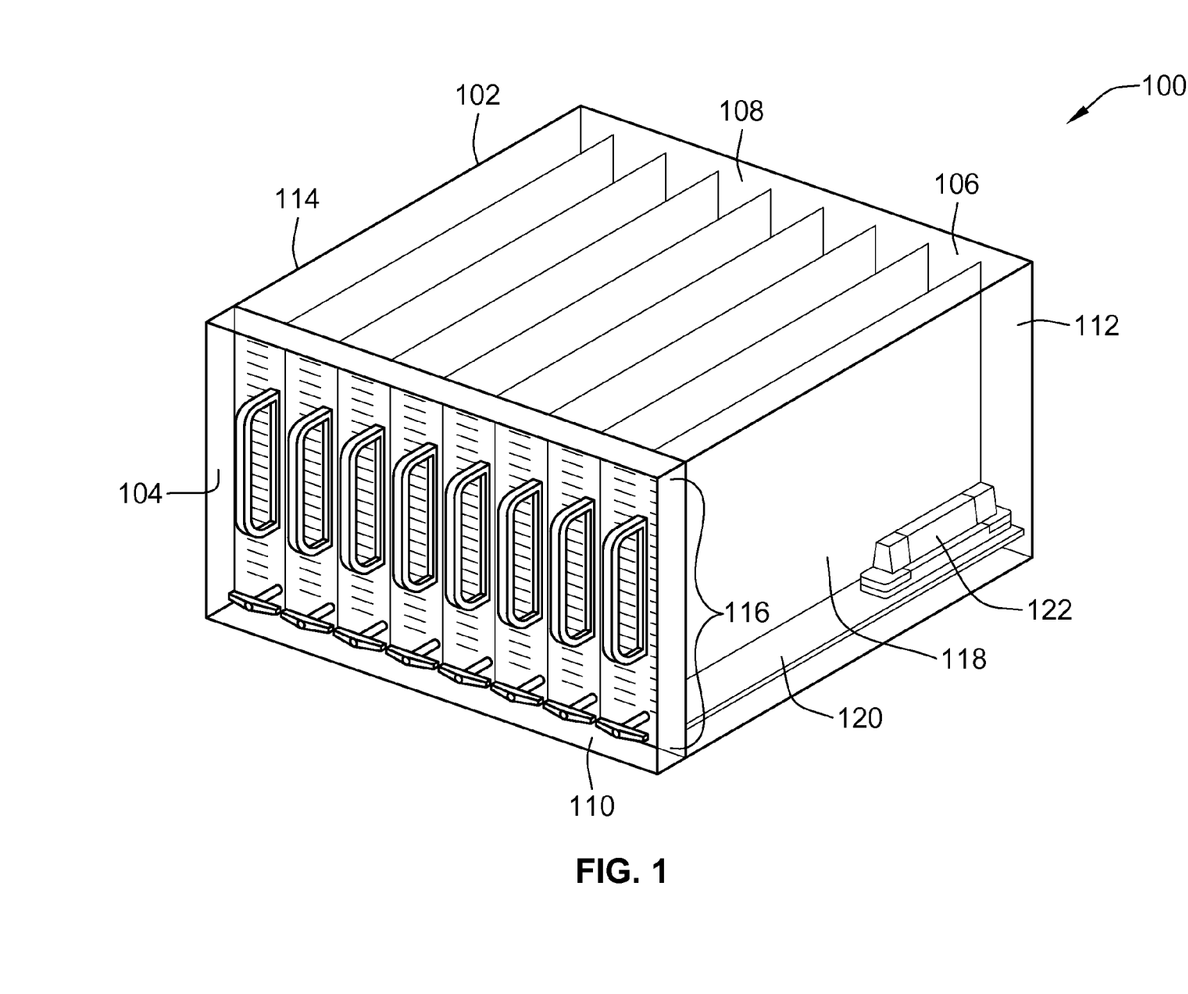
FIG. 1 is a perspective view of a blade server system in accordance with one embodiment.

FIG. 1 is a perspective view of a blade server system 100 in accordance with one embodiment. While the embodiments are described herein in terms of a blade server system, the embodiments described herein may be used in one or more other types of systems, such as rack-mount server systems and other non-server based systems. The blade server system 100 includes a housing 102 that has opposite front and back faces 104, 106, opposite top and bottom faces 108, 110, and opposite left and right faces 112, 114. The housing 102 has a shape of a right rectangular prism, or a rectangular cuboid. For example, the opposite faces of the housing 102 are approximately equal in size and the angles between intersecting faces are perpendicular, or at least approximately perpendicular. Alternatively, the housing 102 may have a different shape.

The front face 104 of the housing 102 includes a board loading opening 116. A plurality of removable circuit boards 118 are loaded into and removed from the housing 102 through the board loading opening 116. In the illustrated embodiment, the removable circuit boards 118 are blade server boards held in a parallel relationship with respect to one another. For example, the removable circuit boards 118 are approximately parallel with respect to one another. The removable circuit boards 118 are capable of being loaded into and removed from the housing 102 multiple times without damaging or otherwise deconstructing the blade server system 100. Each of the removable circuit boards 118 may be a printed circuit boards having one or more electronic components (not shown) mounted thereon. The electronic components may include, by way of example only, hard drives, power supplies, network connectors, input/output devices and connectors, integrated circuits and processors, and the like.

A mother circuit board, or motherboard, 120 is disposed within the housing 102 in a location proximate to the bottom face 110. For example, the motherboard 120 may be located in the housing 102 in a position that is approximately parallel to the bottom face 110 and that is closer to the bottom face 110 than the top face 108. In the illustrated embodiment, the motherboard 120 is disposed in a non-parallel relationship with respect to the removable circuit boards 118. For example, the motherboard 120 may be approximately perpendicular with, respect to the removable circuit boards 118. An electrical connector, or connector assembly, 122 is mounted to the motherboard 120. The connector assembly 122 may mate with one or more removable circuit boards 118 to electrically couple the removable circuit boards 118 with the motherboard 120 to permit electronic communication of data signals and electric power among the removable circuit boards 118 and the motherboard 120.

A backplane board 400 (shown in FIG. 4) is provided in a location that is proximate to the back face 106. For example, the backplane board 400 may include a circuit board that is disposed approximately parallel to the back face 106. One or more of the removable circuit boards 118 and the motherboard 120 is electrically coupled with the backplane board 400. The backplane board 400 includes one or more electrical connectors (not shown) mounted to the backplane board 400. The electrical connectors may protrude through the back face 106 of the housing 102 to permit one or more peripheral devices (not shown) to mate with the electrical connectors and thereby electronically communicate with the backplane board 400. In one embodiment, one or more of the removable circuit boards 118 and the motherboard 120 electronically communicate with the peripheral devices via the backplane board 400. For example, one or more of the connector assemblies 122 may electrically couple one or more of the removable circuit boards 118 and the motherboard 120 with the backplane board 400 to permit communication among the removable circuit boards 118, motherboard 120 and peripheral devices.

Figure 2:
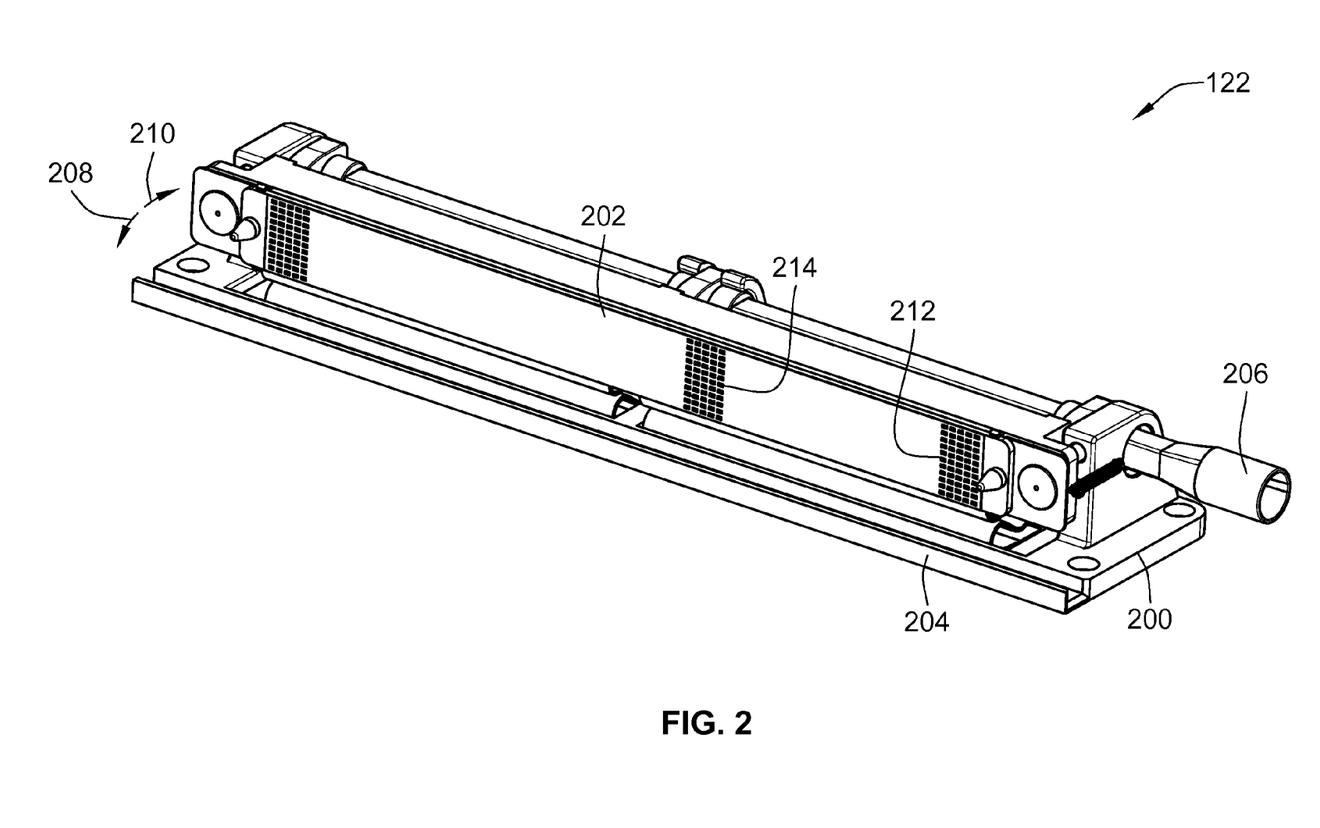
FIG. 2 is a perspective view of the connector assembly shown in FIG. 1 according to one embodiment.

FIG. 2 is a perspective view of the connector assembly 122 according to one embodiment. The connector assembly 122 includes a housing 200 that holds a mating interface 202 and a mounting interface 304 (shown in FIG. 3). The housing 200 includes or is formed from a conductive material, such as a metal. Alternatively, the housing 200 includes or is formed from a dielectric material, such as a polymer. The housing 200 includes a bottom side 204 that is mounted to the motherboard 300 (shown in FIG. 3) to secure the housing 200 to the motherboard 300.

In the illustrated embodiment, the mating interface 202 is an approximately planar plate that engages at least one of the removable circuit boards 118 (shown in FIG. 1) to mate with the removable circuit board 118. The mating interface 202 engages the removable circuit board 118 to establish an electronically communicative pathway between the connector assembly 122 and the removable circuit board 118. The mating interface 202 includes one or more contacts 214. By way of example only, the contacts 214 may include pins, conductive pads, sockets, and the like, to electronically couple the mating interface 202 and the connector assembly 122 with the removable circuit board 118.

A rotatable cam 206 is disposed within the housing 200 and is at least partially rotatable with respect to the housing 200. Rotating the cam 206 in opposite directions moves the mating interface 202 toward and away from the housing 200 in opposing engagement and disengagement directions 208, 210. For example, rotating the cam 206 in one direction moves the mating interface 202 in the engagement direction 208 to mate the mating interface 202 with the removable circuit board 118. Rotating the cam 206 in the opposite direction moves the mating interface 202 in the disengagement direction 210 to separate the mating interface 202 from the removable circuit board 118. Alignment pins 212 disposed on the mating interface 202 are received in corresponding alignment cavities (not shown) in the removable circuit board 118 to align the mating interface 202 with the removable circuit board 118. In another embodiment, an actuating tab similar to the tab 612 (shown in FIG. 6) may be used to engage and disengage the mating interface 202 with the removable circuit board 118.

Figure 3:
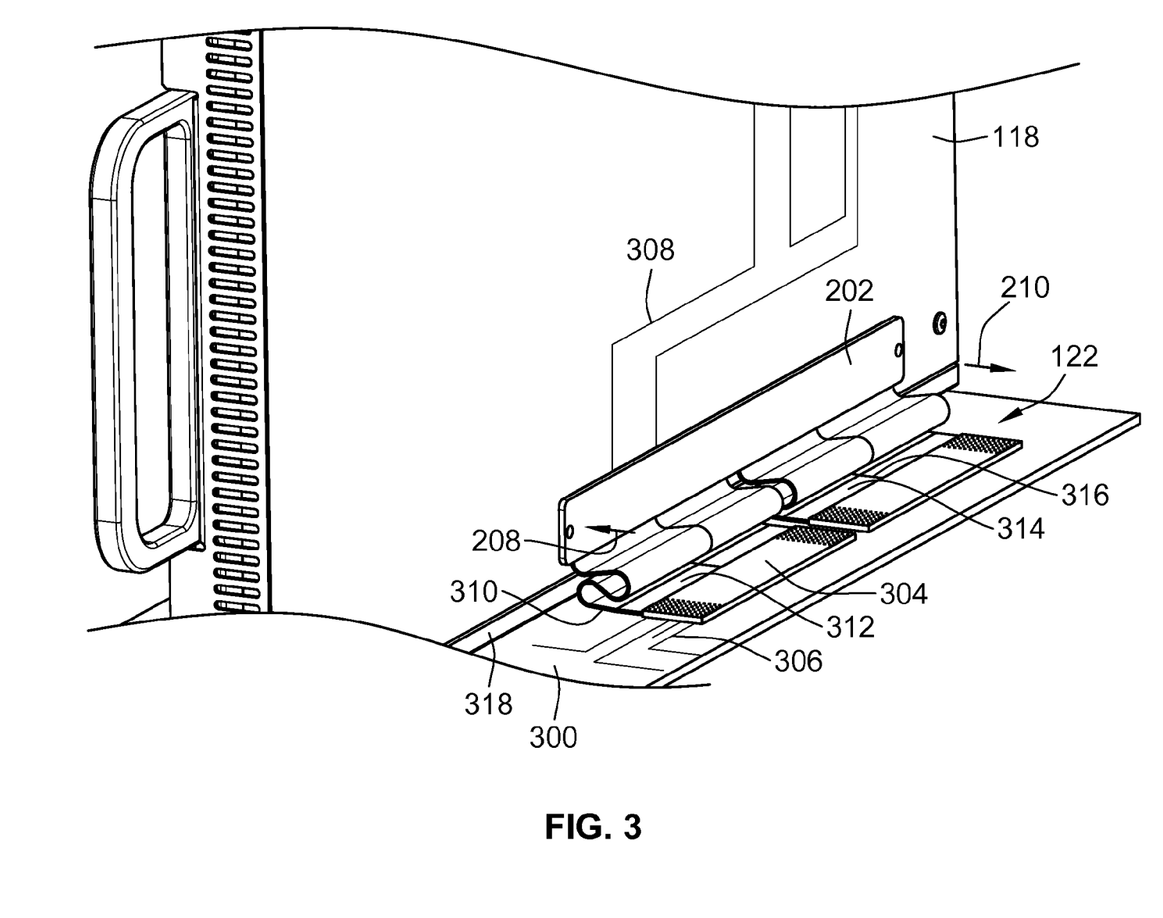
FIG. 3 is a perspective view of the connector assembly shown in FIG. 1 mounted to a motherboard in accordance with one embodiment.

FIG. 3 is a perspective view of the connector assembly 122 mounted to the motherboard 300 in accordance with one embodiment. The connector assembly 122 is shown in FIG. 3 with the housing 200 (shown in FIG. 2) and cam 206 (shown in FIG. 2) removed. The motherboard 300 includes one or more elongated rails 318 that guide the removable circuit boards 118 along the motherboard 300 when the removable circuit boards 118 are loaded into the housing 102 (shown in FIG. 1) of the blade server system 100 (shown in FIG. 1). For example, the rails 318 may be provided in pairs that receive one of the removable circuit boards 118 between the rails 318 and guide the removable circuit board 118 into position to mate with the connector assembly 122.

The mounting interface 304 is disposed proximate to the bottom side 204 (shown in FIG. 2) of the connector assembly 122. In the illustrated embodiment, the mounting interface 304 is an approximately planar plate that mates with the motherboard 300. In one embodiment, the mounting interface 304 engages the motherboard 300 to permit the mounting interface 304 to electronically couple with the motherboard 300. For example, the mounting interface 304 may be flush with the bottom side 204 to enable contacts (not shown) of the mounting interface 304 to mate with the motherboard 300. Alternatively, the mounting interface 304 may be mounted to the motherboard 300 to secure the connector assembly 122 to the motherboard 300. For example, the mounting interface 304 may be affixed to the motherboard 300 to mechanically secure the connector assembly 122 with the motherboard 300. In another embodiment, the mounting interface 304 may be separable from the motherboard 300 such that the mounting interface 304 may be repeatedly removed from and mated with the motherboard 300 without damaging or deconstructing the connector assembly 122 or motherboard 300. In the illustrated embodiment, the mounting interface 304 is divided into two sections. Alternatively, the mounting interface 304 may be a single, unitary body. In another embodiment, the mounting interface 304 may be divided into a greater number of sections. While the mating interface 202 is shown as a single body, the mating interface 202 may be divided into two or more sections similar to the mounting interface 304.

The mounting interface 304 may include contacts (not shown) similar to the contacts 214 (shown in FIG. 2) of the mating interface 202 to engage the motherboard 300 and provide one or more electrically conductive pathways between the motherboard 300 and the connector assembly 122. The motherboard 300 includes conductive pathways 306 that provide electrically communicative pathways for data signals and/or electric power to be communicated within the motherboard 300. For example, the conductive pathways 306 may be conductive traces in the motherboard 300 that enable the communication of data signals and/or electric power between the connector assembly 122 and one or more of another removable circuit board 118 and peripheral devices (not shown) mounted to the motherboard 300. The removable circuit board 118 includes conductive pathways 308 that similarly provide electrically conductive pathways for the communication of data signals and/or electric power. The conductive pathways 308 may enable communication of data signals and/or electric power between peripheral devices mounted to the removable circuit board 118 and the connector assembly 122. The connector assembly 122 can provide for electronic communication between the removable circuit board 118 and the motherboard 300 via the mating interface 202 and mounting interface 304.

As shown in FIG. 3, the mating and mounting interfaces 202, 304 are disposed in a perpendicular relationship. For example, the mating interface 202 may be disposed approximately perpendicular with respect to the mounting interface 304 when the mating interface 202 is moved in the engagement direction 208 to engage the removable circuit board 118. The mating interface 202 may be disposed at a non-perpendicular angle with respect to the mounting interface 304 when the mating interface 202 is moved away from the removable circuit board 118 in the disengagement direction 210.

A flexible circuit member 310 extends between the mating interface 202 and the mounting interface 304. The flexible circuit member 310 is a flexible film that holds one or more electrically conductive pathways 316. The electrically conductive pathways 316 may be conductive traces that permit communication of data signals and/or electronic power through the connector assembly 122 between the mating interface 202 and the mounting interface 304. The flexible circuit member 310 may include a flexible dielectric material that holds the conductive pathways 316. By way of example only, the flexible circuit member 310 may be formed from a polyimide film that holds the conductive pathways 316. Alternatively, the flexible circuit member 310 may include or be formed from a different material that is capable of repeatedly flexing without damaging or fatiguing the flexible circuit member 310. For example, the flexible circuit member 310 may include or be formed of a material other than a polyimide film that is capable of repeatedly flexing without plastically deforming as the mating interface 202 moves toward and away from the removable circuit board 118 along the engagement and disengagement directions 208, 210.

In the illustrated embodiment, the flexible circuit member 310 is divided into first and second ribbons 312, 314. The first ribbon 312 electrically couples the mating interface 202 with one section of the mounting interface 304 while the second ribbon 314 electrically couples the mating interface 202 with the other section of the mounting interface 304. The flexible circuit member 310 may be divided into the ribbons 312, 314 outside of the mating and mounting interfaces 202, 304 but be continuous within the mating interface 202. For example, with the mating interface 202, the flexible circuit member 310 may not be divided into the ribbons 312, 314 and may be approximately continuous with the surface area of the mating interface 202 that engages the removable circuit board 118. Alternatively, the flexible circuit member 310 may be a single film between the mating and mounting interfaces 202, 304 that is not divided into ribbons or sections. In another embodiment, the flexible circuit member 310 is divided into a greater number of ribbons.

Figure 4:
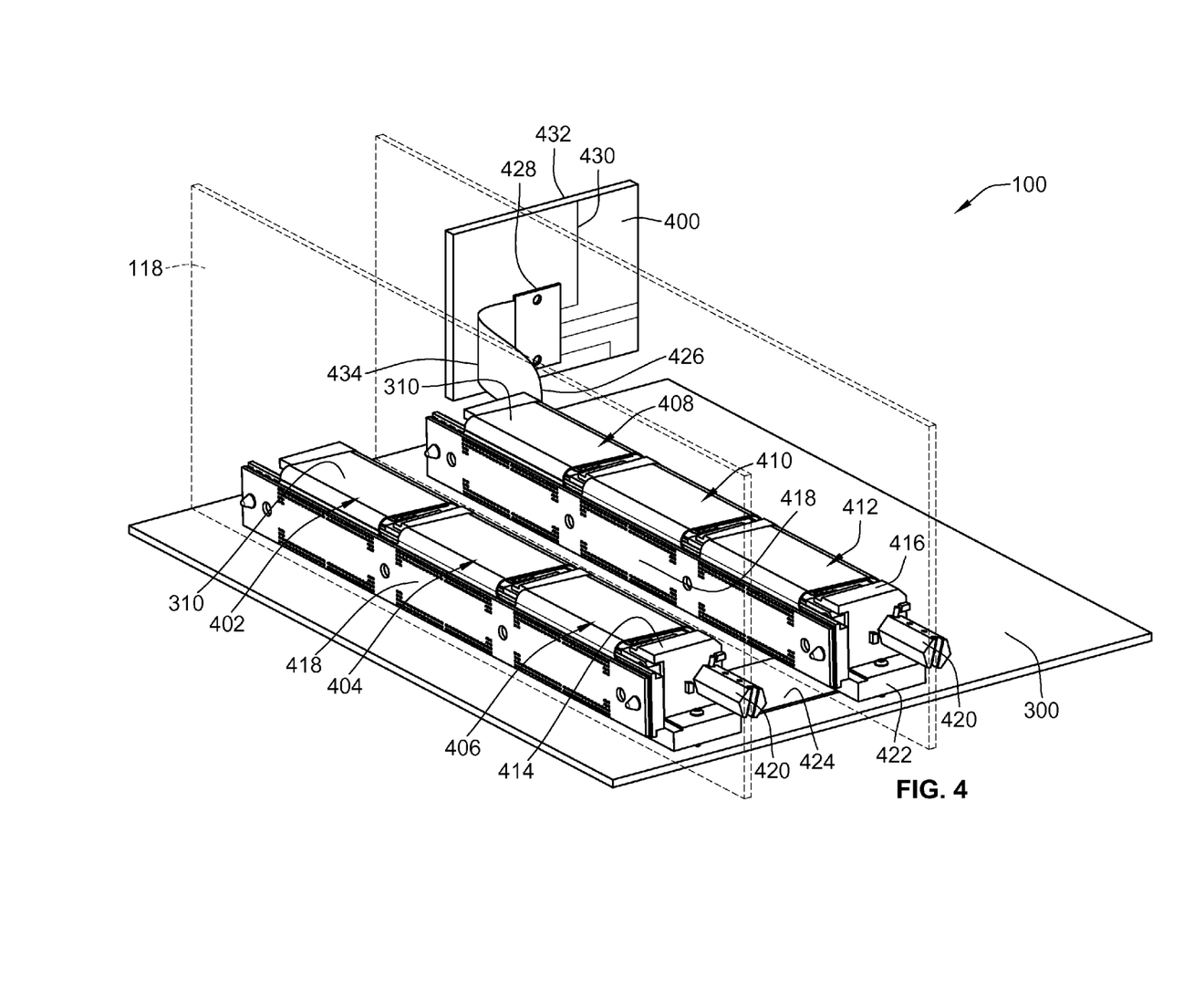
FIG. 4 is a perspective view of the blade server system in accordance with one embodiment.

FIG. 4 is a perspective view of the blade server system 100 in accordance with one embodiment. The blade server system 100 is shown in FIG. 4 with the housing 102 (shown in FIG. 1) removed and the removable circuit boards 118 drawn in phantom lines. The backplane board 400 in the illustrated embodiment has a reduced size to permit increased airflow through the blade server system 100. For example, the backplane board 400 has a smaller surface area on each of opposite sides of the backplane board 400 than the back face 106 (shown in FIG. 1) of the housing 102. In embodiments where the housing 102 includes a wire mesh or other component to permit airflow to pass through the housing 102, the reduced size of the backplane board 400 relative to the back face 106 may result in increased airflow passing through the front face 104 (shown in FIG. 1) of the housing 102, between the removable circuit boards 118, and out through the back face 106. Increased airflow through the housing 102 may more quickly dissipate thermal energy and heat caused by operation of electronic components (not shown) mounted to one or more of the removable circuit boards 118, the motherboard 300 and the backplane board 400.

A plurality of connector assemblies 414, 416 are mounted to the motherboard 300 to electrically couple the removable circuit boards 118 to the motherboard 300 and/or the backplane board 400. Each connector assembly 414, 416 may be similar to the connector assembly 122 shown in FIG. 1. For example, each connector assembly 414, 416 includes one or more flexible circuit members 310, a housing 422 similar to the housing 200 (shown in FIG. 2), three mating interfaces 418 similar to the mating interface 202 (shown in FIG. 2), a mounting interface (not shown) similar to the mounting interface 304 (shown in FIG. 3) and a rotatable cam 420 similar to the rotatable cam 206 (shown in FIG. 2). A different number of connector assemblies 414, 416, mating interfaces 418, mounting interfaces, rotatable cams 420, and the like, may be provided in alternative embodiments. As shown in FIG. 4, the flexible circuit members 310 extend along the exterior of the connector assemblies 414, 416. For example, the flexible circuit members 310 are provided outside of and wrap around the exterior of the housing 422.

Each connector assembly 414, 416 is mated with a different removable circuit board 118. The connector assemblies 414, 416 engage the removable circuit boards 118 and hold the removable circuit boards 118 in a parallel relationship with respect to one another. The flexible circuit member 310 of the connector assembly 414 is divided into three ribbons 402-406 and the flexible circuit member 310 of the connector assembly 416 is divided into three ribbons 408-412. Two or more of the ribbons 402-406 in the connector assembly 414 may include conductive pathways 316 (shown in FIG. 3) that electronically couple two or more of the mating interfaces 418 in the connector assembly 414. Similarly, two or more of the ribbons 408-412 in the connector assembly 416 may include conductive pathways 316 that electronically couple two or more of mating interfaces 418 within the connector assembly 416.

The flexible circuit members 310 of the connector assemblies 414, 416 are connected with one another via a bridge portion 424 of the flexible circuit member 310. For example, the ribbon 406 of the connector assembly 414 and the ribbon 412 of the connector assembly 416 are joined with one another by the bridge portion 424. The bridge portion 424 may be a continuous section of the flexible circuit member 310 in each connector assembly 414, 416. For example, the flexible circuit member 310 in the connector assembly 414, the bridge portion 424 and the flexible circuit member 310 in the connector assembly 416 may be formed as a unitary body. One or more conductive pathways 316 (shown in FIG. 3) may electrically couple the connector assembly 414 with the connector assembly 416 by extending through the flexible circuit member 316 of the connector assembly 414, through the bridge portion 424 and through the flexible circuit member 316 of the connector assembly 416. The conductive pathways 316 disposed within the bridge portion 424 may be electronically decoupled from the motherboard 300. For example, one or more of the conductive pathways 316 may not be electronically connected with the motherboard 300. In one embodiment, the bridge portion 424 includes at least one conductive pathway 316 that bypasses the motherboard 300 to electrically couple the connector assembly 414 with the connector assembly 416.

Conductive pathways 316 (shown in FIG. 3) that electronically couple the connector assemblies 414, 416 with one another without being electronically connected with the motherboard 300 or the conductive pathways 306 (shown in FIG. 3) of the motherboard 300 may have reduced skew in data signals communicated along the conductive pathways 316. For example, the conductive pathways 316 that bypass the motherboard 300 may be disposed within a single material or type of material of the flexible circuit member 310, as opposed to other conductive pathways that extend from one connector assembly to a motherboard, through the motherboard to another connector assembly, and through the other connector assembly. Reducing the number and/or variety of materials through which conductive pathways 316 extend between separate and distinct connector assemblies 414, 416 may reduce the time skew in differential data signals communicated along the conductive pathways 316.

Conductive pathways 316 (shown in FIG. 3) that bypass the motherboard 300 to electronically couple the connector assemblies 414, 416 with one another may increase the space available on the motherboard 300 for other uses. For example, bypassing the motherboard 300 may eliminate the need for additional contacts (not shown) on the motherboard 300 to enable an electronic coupling between the conductive pathways 316 in the flexible circuit member 310 of the connector assemblies 414, 416. As the conductive pathways 316 that bypass the motherboard 300 may not be electrically joined with the motherboard 300, the space on the surface of the motherboard 300 that would have been used for contacts with the conductive pathways 316 may be used for other components, such as additional conductive pathways 306 of the motherboard 300.

The flexible circuit member 310 of the connector assembly 416 includes an interconnect section 426 that extends from the connector assembly 416 to a backplane interface 428. In the illustrated embodiment, the ribbon 408 includes the interconnect section 426. The interconnect section 426 includes an approximately right-angle bend 434 across a gap between the backplane board 400 and the connector assembly 416 to join the backplane board 400 with the connector assembly 416. Alternatively, the bend 434 may be a differently angled bend. The backplane interface 428 is an approximately planar plate that is mounted to the backplane board 400 in the illustrated embodiment. Alternatively, the backplane interface 428 may be separable from the backplane board 400. Similar to the mating interfaces 202 (shown in FIG. 2), the backplane interface 428 includes contacts (not shown) that engage the backplane board 400. The backplane board 400 includes conductive pathways 430, such as conductive traces, that are electronically coupled with the contacts in the backplane interface 428. The conductive pathways 430 extend through the backplane board 400 to one or more connectors (not shown) mounted to a back side 432 of the backplane board 400. The connectors on the back side 432 may provide a mating interface proximate the back face 106 (shown in FIG. 1) of blade server system 100 (shown in FIG. 1) to enable peripheral devices (not shown) to communicate data signals and/or electronic power with the backplane board 400.

The interconnect section 426 includes one or more conductive pathways 316 (shown in FIG. 3) to electrically join the one or more of the connector assemblies 414, 416 with the backplane board 400. Similar to the bridge portion 424 of the flexible circuit member 310, the interconnect section 426 enables a conductive pathway to extend from the connector assembly 416 to the backplane board 400 while bypassing the motherboard 300 and other devices or components. The flexible circuit member 310 may provide one or more conductive pathways 316 that electronically join a plurality of the connector assembly 414, the connector assembly 416 and the backplane board 400 with one another while bypassing the motherboard 300. For example, one or more conductive pathways 316 may be provided along a path that extends through the connector assembly 414, from the connector assembly 414 to the connector assembly 416 across the bridge portion 424, through the connector assembly 416 and to the backplane board 400 without electrically contacting the motherboard 300. Optionally, one or more of the conductive pathways 316 may be electrically joined with the motherboard 300.

As shown in FIG. 4, the flexible circuit member 310 provides conductive pathways 316 (shown in FIG. 3) that electronically join the removable circuit boards 118, the motherboard 300 and the backplane board 400 when the removable circuit boards 118, the motherboard 300 and the backplane board 400 are in a non-parallel relationship with respect to one another. For example, the removable circuit boards 118, the motherboard 300 and the backplane board 400 are approximately orthogonal with respect to one another. In the illustrated embodiment, each of the removable circuit boards 118 is disposed approximately perpendicular with respect to the motherboard 300 and the backplane board 400. The motherboard 300 is located approximately perpendicular with respect to the removable circuit boards 118 and the backplane board 400. Alternatively, two or more of the removable circuit boards 118, the motherboard 300 and the backplane board 400 are disposed at an angle other than a right angle with respect to one another. In another embodiment, two or more of the removable circuit boards 118, the motherboard 300 and the backplane board 400 are approximately parallel with respect to one another.

Figure 5:
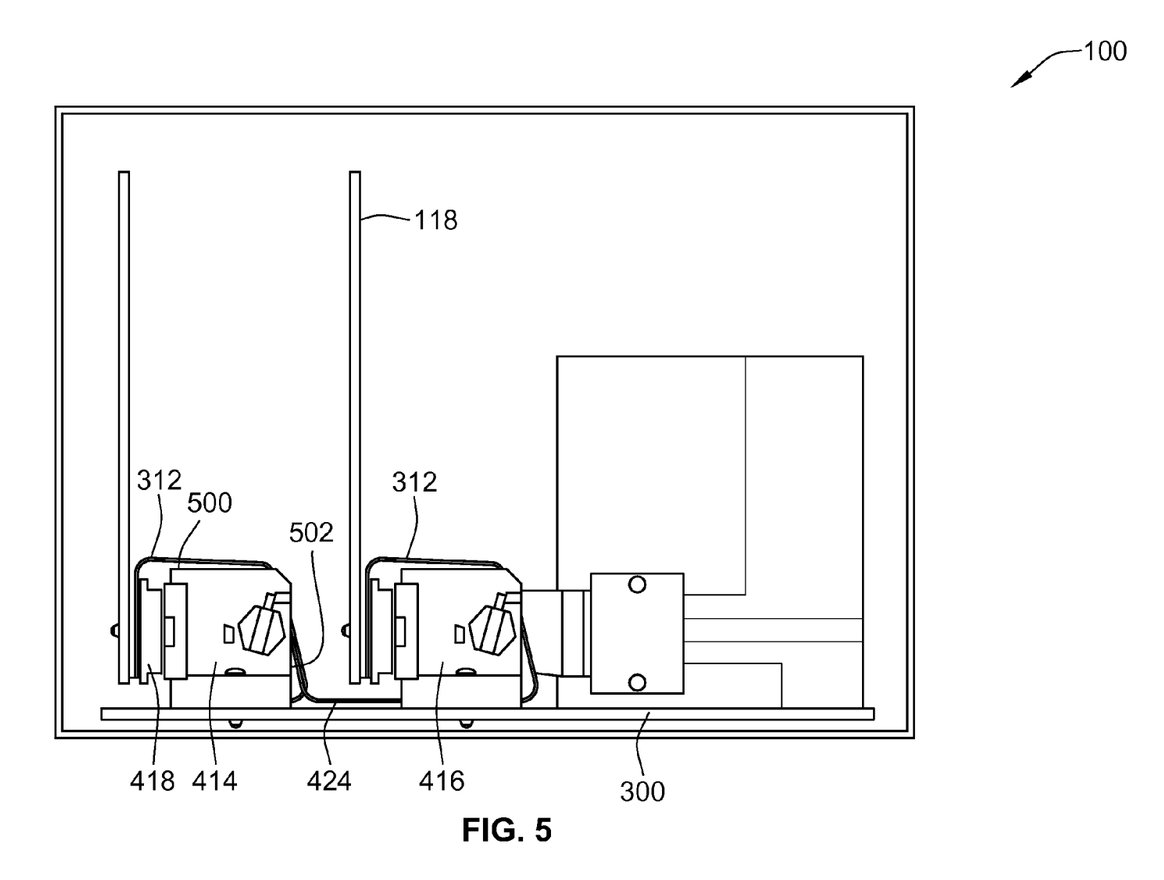
FIG. 5 is an elevational view of the blade server system shown in FIG. 4 in accordance with one embodiment.

FIG. 5 is an elevational view of the blade server system 100 in accordance with one embodiment. The view of the blade server system 100 in FIG. 5 shows the path by which the flexible circuit member 310 extends between the connector assemblies 414, 416. The flexible circuit member 310 is held within the mating interface 418 of the connector assembly 414, continues out of the mating interface 418 and above a top exterior surface 500 of the connector assembly 414. The flexible circuit member 310 extends across a side exterior surface 502 of the connector assembly 414 to the bridge portion 424. The top and side exterior surfaces 500, 502 intersect one another in the illustrated embodiment.

The bridge portion 424 extends between the connector assemblies 414, 416 between the removable circuit board 118 mated with the connector assembly 416 and the motherboard 300. The bridge portion 424 continues into the connector assembly 416 where the conductive pathways 316 (shown in FIG. 3) of the flexible circuit member 310 may be connected with contacts (not shown) in the connector assembly 416 or the mating interface 418 of the connector assembly 416. Alternatively, the bridge portion 424 may not extend into the connector assembly 416 and may be joined with the mating interface 418 of the connector assembly 416 outside of the connector assembly 416.

Figure 6:
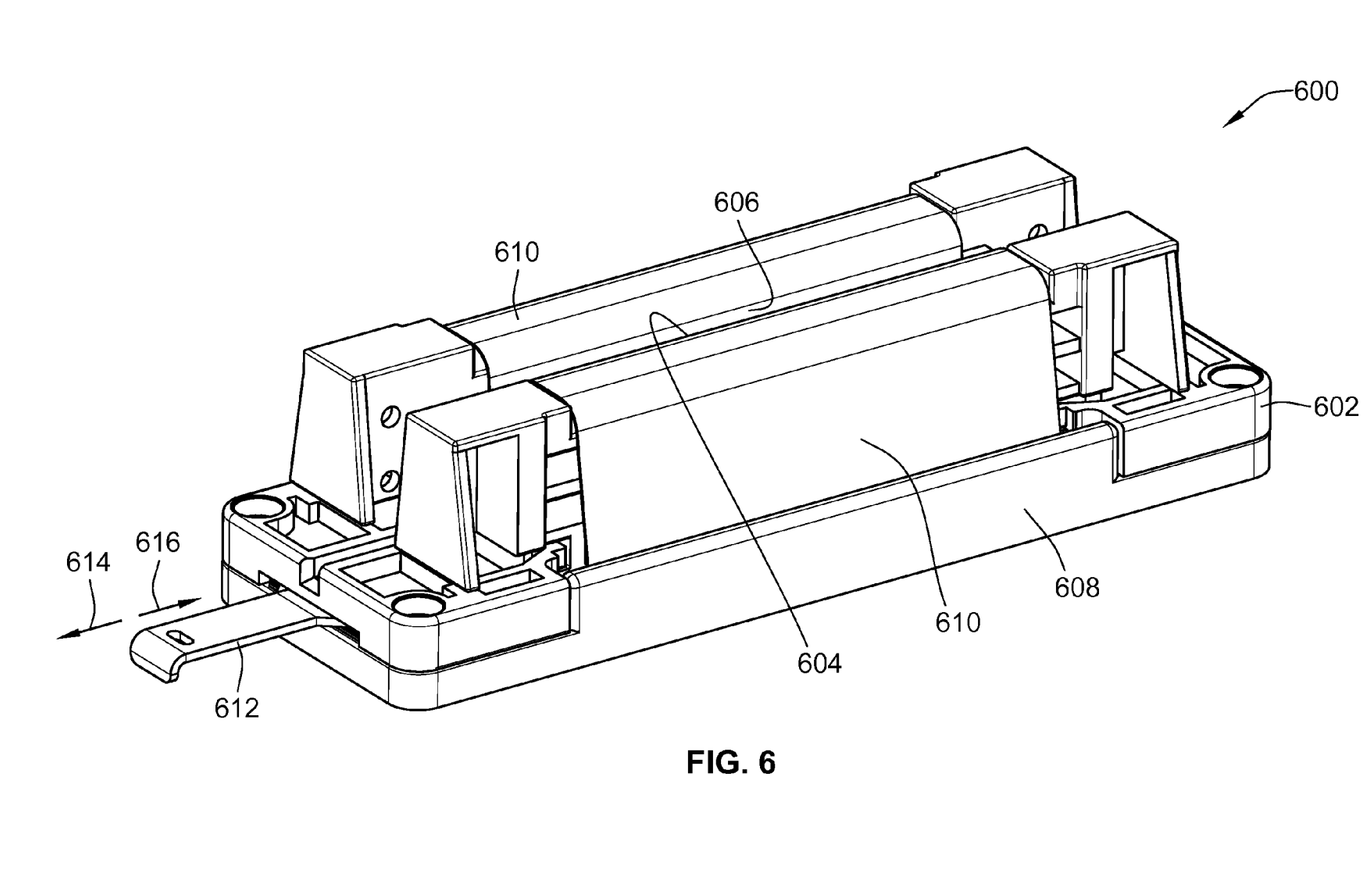
FIG. 6 is a perspective view of a connector assembly according to an alternative embodiment.

FIG. 6 is a perspective view of a connector assembly 600 according to an alternative embodiment. The connector assembly 600 is similar to the connector assembly 122 (shown in FIG. 1). For example, the connector assembly 600 mates with a removable circuit board 118 (shown in FIG. 1) to electrically couple the connector assembly 600 with the removable circuit board 118. The connector assembly 600 is mounted to and electrically joined with the motherboard 300 (shown in FIG. 3). The connector assembly 600 may provide for electronic communication between the removable circuit board 118 with the motherboard 300.

The connector assembly 600 includes a housing 602. Similar to the housing 200 (shown in FIG. 2), the housing 602 may include or be formed from a conductive material, such as a metal. Alternatively, the housing 602 may include or be formed from a dielectric material, such as a polymer. A bottom side 608 of the housing 602 is mounted to the motherboard 300 (shown in FIG. 3). A mounting interface 704 (shown in FIG. 7) that is similar to the mounting interface 304 (shown in FIG. 3) may be disposed at or proximate to the bottom side 608 to electronically couple the connector assembly 600 with the motherboard 300.

The connector assembly 600 includes opposing mating interfaces 604, 606. At least one of the removable circuit boards 118 (shown in FIG. 1) is received between the mating interfaces 604, 606. Each of the mating interfaces 604, 606 may be similar to the mating interface 202 (shown in FIG. 2). For example, the mating interfaces 604, 606 may include contacts (not shown) to permit electronic coupling between the mating interfaces 604, 606 and the removable circuit board 118. The mating interface 604 engages one side 700 (shown in FIG. 7) of the removable circuit board 118 while the mating interface 606 engages an opposite side 702 (shown in FIG. 7) of the removable circuit board 118.

A tab 612 is moved in opposite actuating directions 614, 616 to disengage and engage the mating interfaces 604, 606 with the removable circuit board 118 (shown in FIG. 1). For example, the tab 612 may be pushed into the housing 602 in the actuating direction 616 to move the mating interfaces 604, 606 toward one another and toward the sides 700, 702 of the removable circuit board 118 to cause the mating interfaces 604, 606 to engage the sides 700, 702 of the removable circuit board 118. The tab 612 may be pulled away from the housing 602 in the opposite actuating direction 614 to move the mating interfaces 604, 606 away from one another and away from the sides 700, 702 of the removable circuit board 118 to disengage the mating interfaces 604, 606 from the removable circuit board 118. Alternatively, a rotating cam similar to the rotating cams 206 (shown in FIG. 2), 420 (shown in FIG. 4) may be used to engage and disengage the mating interfaces 604, 606 with the removable circuit board 118.

A flexible circuit member 610 is coupled with the mating interfaces 604, 606. The flexible circuit member 610 may be similar to the flexible circuit member 310 (shown in FIG. 3). The flexible circuit member 610 includes one or more conductive pathways 618 that may be arranged to provide communicative pathways among two or more of the mating interface 604, the mating interface 606, the motherboard 300 (shown in FIG. 3), the connector assemblies 122 (shown in FIG. 1), 414, 416 (shown in FIG. 4), another connector assembly 600 and the backplane board 400 (shown in FIG. 4). In the illustrated embodiment, the flexible circuit member 610 is wrapped around the exterior of the housing 602 from the mating interfaces 604, 606 and enters into the housing 602 in a location that is proximate to the bottom side 608. The flexible circuit member 610 may be joined with contacts (not shown) at or near the bottom side 608 to provide for the communication of data signals and/or electronic power between the mating interfaces 604, 606 and the motherboard 300. Alternatively, the flexible circuit member 610 may be divided into two or more ribbons similar to the ribbons 312, 314 (shown in FIG. 3), 402-412 (shown in FIG. 4), include a bridge portion similar to the bridge portion 424 (shown in FIG. 4) and/or include an interconnect section similar to the interconnect section 426 (shown in FIG. 4).

Figure 7:
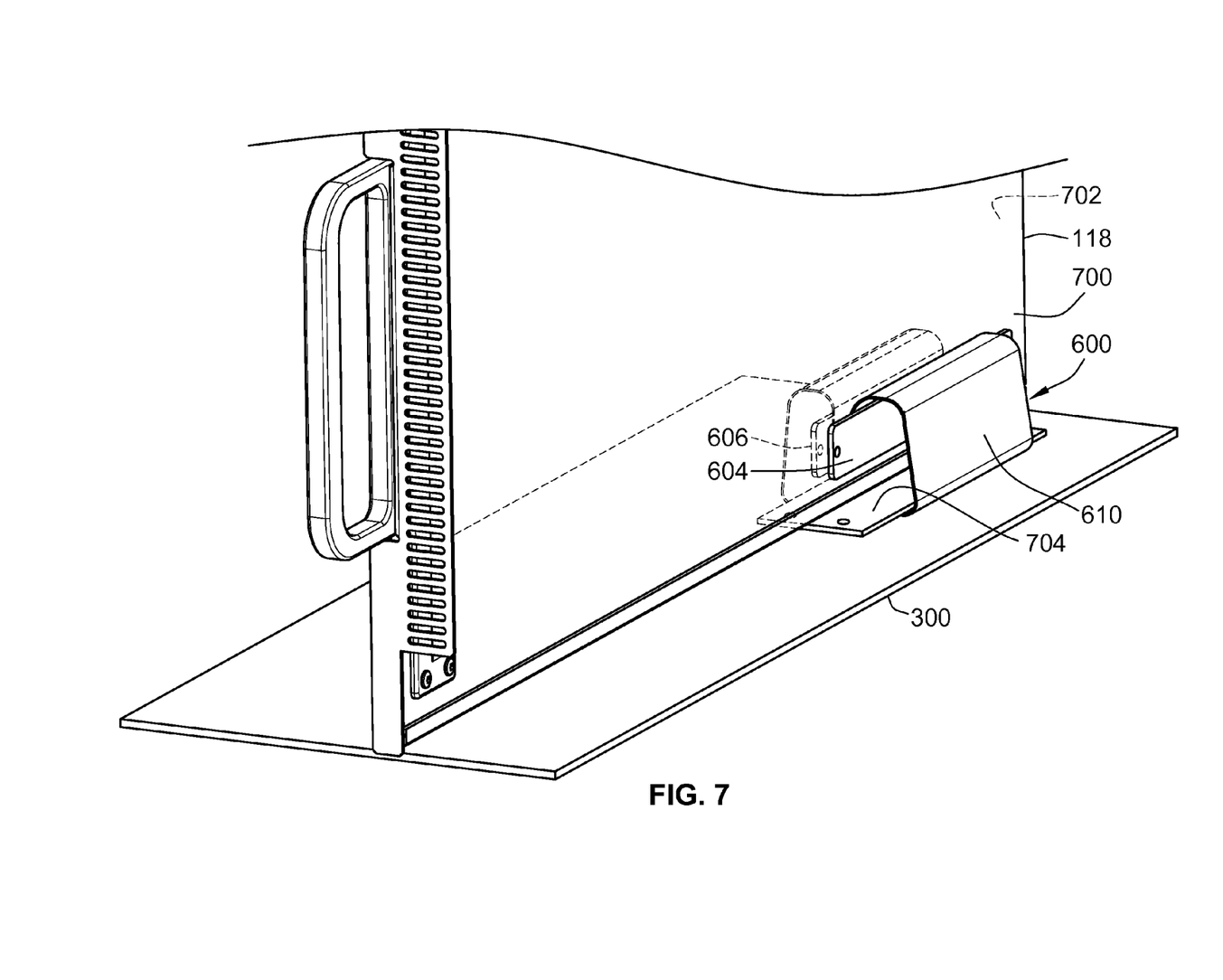
FIG. 7 is a perspective view of the connector assembly 6 shown in FIG. 6 in accordance with one embodiment.

FIG. 7 is a perspective view of the connector assembly 600 mounted to the motherboard 300 in accordance with one embodiment. The connector assembly 600 is shown in FIG. 7 with the housing 602 (shown in FIG. 6) and tab 612 (shown in FIG. 6) removed and with the removable circuit board 118 being at least partially translucent. The mounting interface 704 is disposed proximate to the bottom side 608 (shown in FIG. 6) of the connector assembly 600. In the illustrated embodiment, the mounting interface 704 is an approximately planar plate that mates with the motherboard 300. The mounting interface 704 engages the motherboard 300 to permit the mounting interface 704 to electronically couple with the motherboard 300. For example, the mounting interface 704 may be flush with the bottom side 608 to enable contacts (not shown) of the mounting interface 704 to mate with the motherboard 300.

The mating interfaces 604, 606 move toward the removable circuit board 118 to engage the opposite sides 700, 702 of the removable circuit board 118. The mating interface 604 moves toward and engages the side 700 and the mating interface 606 moves toward and engages the side 702 to electronically couple the connector assembly 600 with the removable circuit board 118. The mating interface 604 may electronically connect with conductive pathways on or located proximate to the side 700 that are similar to the conductive pathways 308 (shown in FIG. 3). The mating interface 606 may electronically connect with conductive pathways on or located proximate to the side 702 that are similar to the conductive pathways 308.

The mating interfaces 604, 606 are disposed in a perpendicular relationship with the mounting interface 704. For example, the mating interfaces 604, 606 may be approximately perpendicular with respect to the mounting interface 704 when the mating interfaces 604, 606 engage the removable circuit board 118. The mating interfaces 604, 606 may be at non-perpendicular angles with respect to the mounting interface 704 when the mating interfaces 604, 606 disengage from the removable circuit board 118.

The flexible circuit member 610 extends from the mating interfaces 604, 606 to the mounting interface 704. One or more electrically conductive pathways that are similar to the conductive pathways 316 (shown in FIG. 3) may provide communicative pathways among the mating interfaces 604, 606 and the mounting interface 704. Data signals and/or electronic power may be communicated between the sides 700, 702 of the removable circuit board 118 and the motherboard 300 via the connector assembly 600. For example, the flexible circuit member 610 may provide conductive pathways to permit communication between the mating interfaces 604, 606 and between one or more of the mating interfaces 604, 606 and the mounting interface 704.

Figure 8:
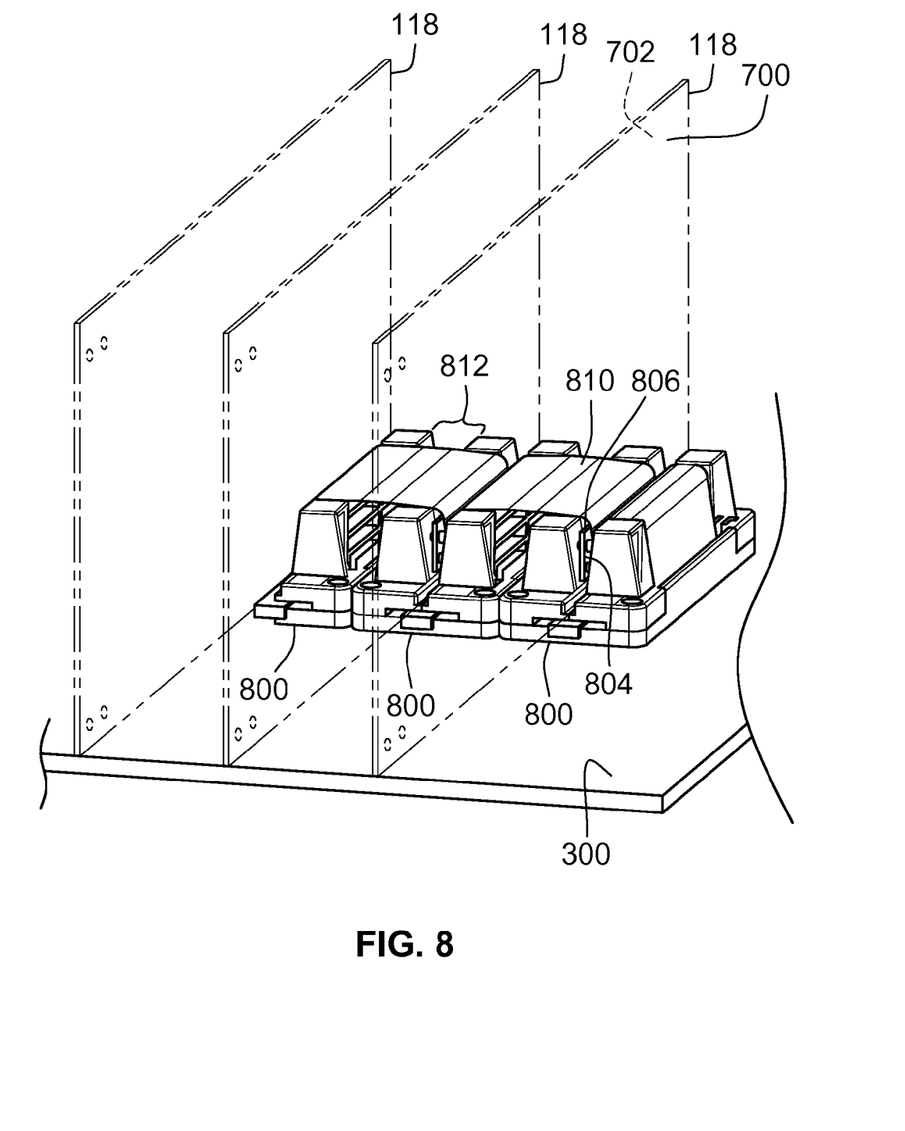
FIG. 8 is a perspective view of several connector assemblies mounted to the motherboard shown in FIG. 3 in accordance with one embodiment.

FIG. 8 is a perspective view of several connector assemblies 800 mounted to the motherboard 300 in accordance with one embodiment. The connector assemblies 800 are similar to the connector assemblies 600 (shown in FIG. 6). For example, each of the connector assemblies 800 includes mating interfaces 804, 806 that are similar to the mating interfaces 604, 606 (shown in FIG. 6) and a mounting interface 808 that is similar to the mounting interface 704 (shown in FIG. 7). Each of the connector assemblies 800 mates with the opposite sides 700, 702 of a different removable circuit board 118.

A flexible circuit member 810 is coupled with the mating interfaces 804, 806. The flexible circuit member 810 may be similar to the flexible circuit members 310 (shown in FIG. 3) and/or 610 (shown in FIG. 6). For example, the flexible circuit member 810 may include one or more conductive pathways (not shown) that are arranged to provide communicative pathways among two or more of the mating interface 804, the mating interface 806, the motherboard 300, the connector assemblies 122 (shown in FIG. 1), 414, 416 (shown in FIG. 4), another connector assembly 800 and the backplane board 400 (shown in FIG. 4). In contrast to the flexible circuit member 610, the flexible circuit member 810 includes a bridge portion 812 that extends between neighboring connector assemblies 800. The bridge portion 812 enables the neighboring connector assemblies 800 to communicate data and/or power between two or more removable circuit boards 118 without using the motherboard 300 to communicate the data and/or power. For example, the mating interface 804 of one connector assembly 800 may communicate a data signal from one removable circuit board 118 to the mating interface 806 of a neighboring connector assembly 800 through the bridge portion 812 of the flexible circuit member 810. The data signal may be communicated through the flexible circuit member 810 without extending through or utilizing any conductive traces in the motherboard 300.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third." etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly for electrically coupling a circuit board with at least one of a motherboard and a backplane board, the connector assembly comprising:
    a connector having a mating interface and a mounting interface, the mating interface for electrically coupling the connector with the circuit board, the mounting interface for securing the connector to the motherboard; and
    a flexible circuit member electrically interconnecting the mating and mounting interfaces with one another and with at least one of the motherboard and the backplane board, wherein the flexible circuit member electrically interconnects the circuit board with the backplane board via a conductive pathway that bypasses the motherboard.

2. The connector assembly of claim 1, wherein two or more of the motherboard, the circuit board and the backplane board are in a non-parallel relationship with respect to one another.

3. The connector assembly of claim 1, wherein the flexible circuit member comprises a conductive trace held in a flexible film.

4. The connector assembly of claim 1, wherein the flexible circuit member comprises a flexible polyimide film.

5. The connector assembly of claim 1, wherein the connector assembly comprises a plurality of the connectors, further wherein the flexible circuit member electrically interconnects the connectors with one another.

6. The connector assembly of claim 5, wherein the flexible circuit member is configured to extend from one of the connectors to another one of the connectors along a path extending between the removable board and the motherboard.

7. The connector assembly of claim 5, wherein the flexible circuit member electrically couples the connectors with one another and electrically couples the connectors with the backplane board.

8. The connector assembly of claim 5, wherein each of the connectors is configured to mate with a different circuit board to electrically interconnect the circuit boards with at least one of the motherboard and the backplane board.

9. The connector assembly of claim 1, wherein the connector assembly comprises a plurality of the connectors and each of the connectors includes a plurality of the mating interfaces disposed opposite one another, further wherein the flexible circuit member electrically couples at least one of the mating interfaces of one of the plurality of the connectors with at least one of the mating interfaces of another one of the plurality of the connectors.

10. The connector assembly of claim 9, wherein the connector receives the circuit board between the mating interfaces, each of the mating interfaces electrically engaging a different side of the circuit board.

11. An electrical connector assembly for electrically interconnecting circuit boards disposed in a parallel relationship with one another, the connector assembly comprising:
   first and second connectors each having a mating interface and a mounting interface, the mating interfaces for engaging and electrically coupling each of the first and second connectors with a different one of the circuit boards, the mounting interfaces for mounting the first and second connectors to a motherboard; and
   a flexible circuit member electrically interconnecting the first and second connectors with one another along a conductive pathway that bypasses the motherboard, wherein the first and second connectors engage the circuit boards in a non-parallel relationship with respect to the motherboard.

12. The connector assembly of claim 11, wherein the first and second connectors engage the circuit boards in a perpendicular relationship with respect to the motherboard.

13. The connector assembly of claim 11, wherein the flexible circuit member includes at least one conductive pathway for electronically connecting one or more of the first and second connectors with the motherboard.

14. The connector assembly of claim 11, wherein the flexible circuit member comprises a flexible film and the conductive pathway comprises a conductive trace held in the flexible film.

15. The connector assembly of claim 11, wherein the flexible circuit member comprises a flexible polyimide film.

16. The connector assembly of claim 11, wherein the flexible circuit member electrically interconnects the first and second connectors with a backplane board.

17. The connector assembly of claim 16, wherein the first and second connectors engage the circuit boards in a non-parallel relationship with respect to the motherboard and the backplane board.

18. The connector assembly of claim 16, wherein the flexible circuit member electrically interconnects the first and second connectors with the backplane board.

19. The connector assembly of claim 11, wherein the flexible circuit member is configured to extend from the first connector to the second connector along a path extending between the motherboard and the circuit board engaged by the second connector.

20. The connector assembly of claim 11, wherein at least one of the first and second connectors includes a plurality of the mating interfaces opposing one another, each of the mating interfaces electrically engaging a different side of at least one of the circuit boards.

* * * * *